United States Patent [19]
Qualich

[11] Patent Number: 5,959,464
[45] Date of Patent: Sep. 28, 1999

[54] LOSS-LESS LOAD CURRENT SENSING DRIVER AND METHOD THEREFOR

[75] Inventor: John R. Qualich, Buffalo Grove, Ill.

[73] Assignee: Motorola Inc., Schaumburg, Ill.

[21] Appl. No.: 08/706,862

[22] Filed: Sep. 3, 1996

[51] Int. Cl.$^6$ .................................................. G01R 31/26
[52] U.S. Cl. ......................... 324/769; 361/103; 324/765
[58] Field of Search .................... 324/769, 768, 324/765, 713; 361/103, 18, 106; 327/513, 582; 307/117; 323/907

[56] References Cited

U.S. PATENT DOCUMENTS

| | | | |
|---|---|---|---|
| 4,595,966 | 6/1986 | Huber et al. | 361/93 |
| 4,779,161 | 10/1988 | DeShazo, Jr. | 361/106 |
| 4,896,245 | 1/1990 | Qualich | 361/103 |
| 4,937,697 | 6/1990 | Edwards et al. | 361/18 |
| 5,008,736 | 4/1991 | Davies et al. | 361/103 |
| 5,119,265 | 6/1992 | Qualich et al. | 361/103 |
| 5,379,230 | 1/1995 | Morikawa et al. | 364/483 |
| 5,581,170 | 12/1996 | Mammano et al. | 320/17 |
| 5,608,595 | 3/1997 | Gourab et al. | 361/79 |
| 5,640,293 | 6/1997 | Dawes et al. | 361/93 |

*Primary Examiner*—Josie Ballato
*Assistant Examiner*—Russell M. Kobert
*Attorney, Agent, or Firm*—Nicholas C. Hopman

[57] ABSTRACT

A loss-less load current sensing driver and method includes providing current (603) to a load from a power supply through a transistor. A voltage drop is measured (605) across the transistor responsive to the provision of current to the load. A temperature of the transistor is measured (607) and a temperature-indicating signal is provided. The temperature-indicating signal is translated (609) into a predicted transistor on-resistance. A magnitude of the current provided to the load is determined dependent on the measured voltage drop across the transistor and the predicted transistor on-resistance, preferably by dividing (611) the measured voltage drop by the predicted transistor on-resistance.

15 Claims, 4 Drawing Sheets

LOSS-LESS LOAD CURRENT SENSING DRIVER AND METHOD THEREFOR

FIELD OF THE INVENTION

This invention is related to the field of semiconductors and more particularly to measuring load current in transistor based load drivers.

BACKGROUND OF THE INVENTION

Electronic control systems often need to drive load devices. Transistor based load drivers that drive these loads must be designed to provide optimal drive capability while offering driver protection in case of an open or short circuit while operating over a wide thermal envelope. Certain types of loads must also be current regulated, so measuring actual load current is important for both protection of the transistor driver, as well as for optimal load control via regulation. Other applications need to measure load current for diagnostic purposes.

Conventional current sensing schemes include insertion of a relatively low resistance resistor in series with the load and the driver transistor. A voltage measured across the resistor is used to indicate the load current. A problem with this approach is that it requires a separate, and usually a relatively bulky component, which is by definition lossy in nature. This series connected resistor generates extra heat as it operates, which makes the driver circuit less reliable.

One loss-less load current sensing scheme applies a current transformer that is magnetically coupled to the load circuit. This scheme is costly, bulky, and is more difficult to manufacture because robust physical mounting of the magnetic current transformer is difficult at best—making it a poor choice in adverse vibration environments such as in an automotive application.

Another loss-less load current sensing scheme is to use a field effect transistor packaged with an integral current mirror. A problem with these devices is that the current mirror circuit requires a significant amount of die area. Furthermore, the current-proportional signal that these integral current mirror based devices provide have a built-in error that changes over the operating temperature of the device.

What is needed is an improved device for driving loads that includes loss-less current sensing that is more physically robust, more reliable, and easier to manufacture.

DETAILED DESCRIPTION OF A PREFERRED EMBODIMENT

A loss-less load current sensing driver and method includes providing current to a load from a power supply through a transistor. A voltage drop is measured across the transistor responsive to the provision of current to the load. A temperature of the transistor is measured and a temperature-indicating signal is provided. The temperature-indicating signal is translated into a predicted transistor on-resistance. A magnitude of the current provided to the load is determined dependent on the measured voltage drop across the transistor and the predicted transistor on-resistance, preferably by dividing the measured voltage drop by the predicted transistor on-resistance.

Essentially, a thermal measurement of the transistor is translated into a predicted RDS-ON (resistance measured between a drain and source terminal of the transistor) coefficient. Also, a VDS (voltage across the transistor's drain and source terminals) signal is measured. Preferably, the VDS signal is divided by the RDS-ON coefficient and a load-current signal, indicative of a current flowing through the load, is generated.

Figure 1:
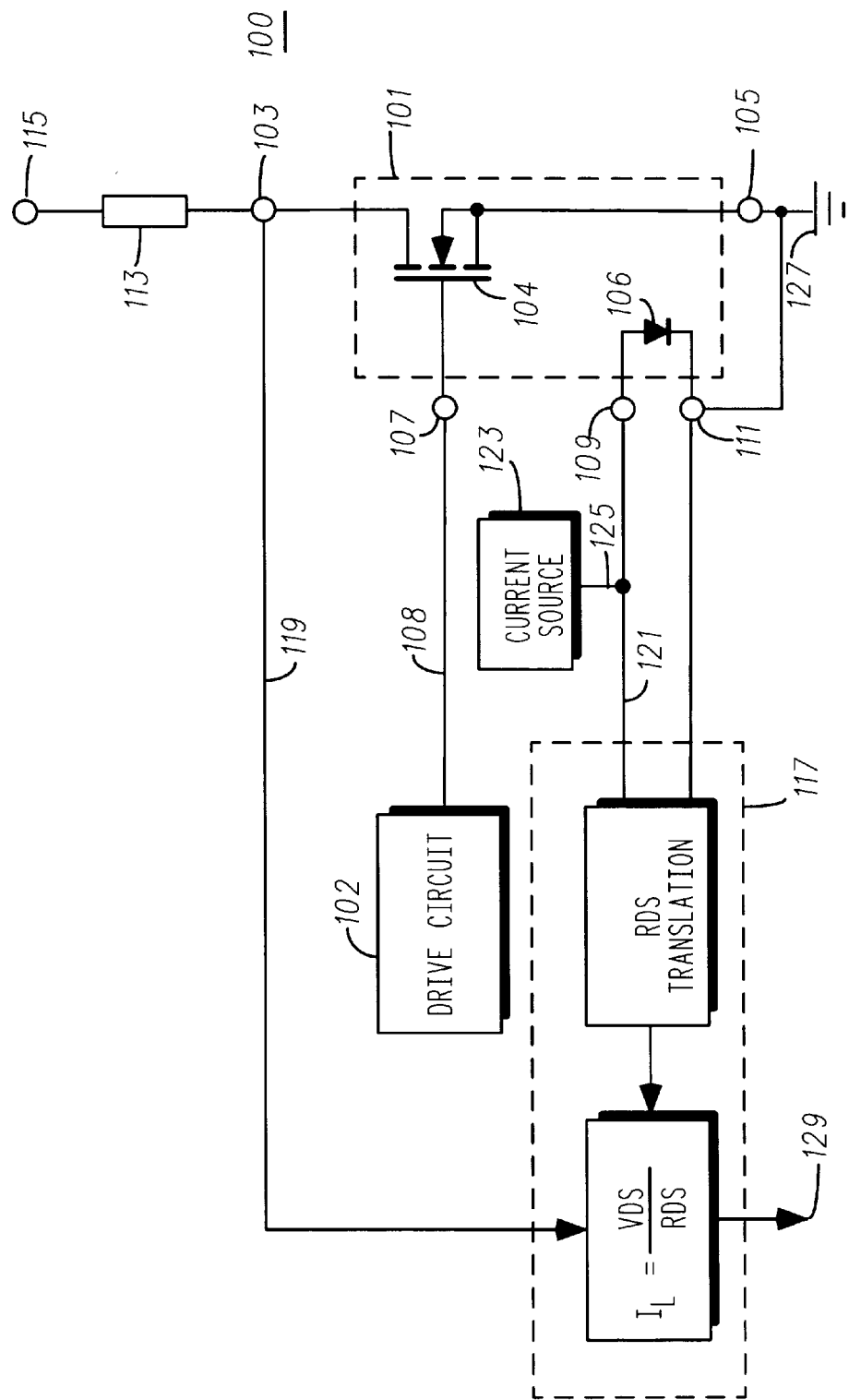
FIG. 1 is a schematic drawing of a load driver in accordance with a first embodiment of the invention.

FIG. 1 is a schematic drawing of a load driver 100 in accordance with a first embodiment of the invention. FIG. 1 includes a drive circuit 102 that provides a drive signal 108. A transistor device 101, here shown with five terminals, includes a field effect transistor portion 104 connected via a first output or drain terminal 103; a second output or source terminal 105; and a gate terminal 107, and an integral silicon diode portion 106 including an anode terminal 109 and a cathode terminal 111. The integral silicon diode portion 106 is disposed on the same die as the field effect transistor portion 104 of the transistor 101. The physical relationship of the diode portion and the transistor portion ensured tight thermal coupling between the respective portions.

The drain terminal 103 of the transistor 101 is coupled to a load 113 which is coupled to a power supply terminal 115. The source terminal 105 of the transistor 101 is coupled to a ground terminal 127. The transistor's gate terminal 107 is driven by the drive signal 108 provided by the drive circuit 102. Note that the load 113 is configured in a low-side configuration. Components can be readily rearranged to be configured in a high-side configuration if desired.

When the drive signal 108 is provided to the gate terminal 107 of the transistor 101, the transistor 101 conducts and current flows in the series-arranged circuit from the power supply terminal 115 through the load 113 through the drain terminal 103 to the source terminal 105 to the ground terminal 127. A VDS signal 119 is generated in response to the provided drive signal 108, and is proportional to an amplitude of the load current flowing in the just-described series-arranged circuit path. Essentially, the VDS signal is a measure of a voltage differential measured between the transistor's drain terminal 103 and the transistor's source terminal 105. Since the transistor 101 acts primarily as a resistive element, the signal 119 is indicative of the product of current through the transistor 101 and the on-channel resistance or RDS-ON of the transistor 101. The VDS signal 119 is fed into a translation circuit 117. The diode portion 106 of the transistor 101 is electrically activated by a bias signal 125 provided by a current source 123 to the anode terminal 109. This bias signal 125 flows through the diode and its cathode terminal 111 to the ground terminal 127. This diode portion 106 of the transistor 101 outputs a temperature-indicating signal 121 that has an amplitude indicative of the temperature proximate the diode portion 106 of the transistor 101. Since the diode portion 106 of the transistor 101 is positioned on the same substrate as the transistor portion 104 of the transistor 101, the temperature of both portions 106 and 104 will be essentially the same. Thus, the temperature-indicating signal 121 will track the temperature of the transistor portion 104 of the transistor 101.

The translation circuit 117 senses the temperature-indicating signal 121 between the anode terminal 109 and the cathode terminal 111 of the diode portion 106 of the transistor 101 and translates the temperature-indicating signal 121 and the VDS signal 119 into a load-current signal 129 indicative of a magnitude of the current flowing through the load.

How this is done will be described in more detail below. First, a few physical relationships will be described.

Figure 2:
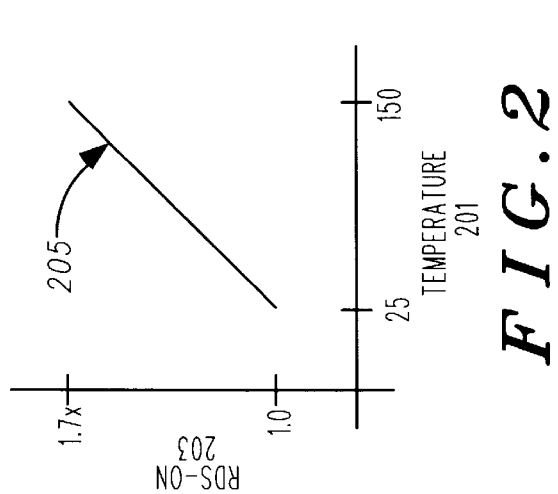
FIG. 2 is a graph illustrating a graphical relationship between temperature and relative RDS-ON of a transistor portion of the load driver introduced in FIG. 1.

FIG. 2 is a graph illustrating a graphical relationship between temperature, on an x-axis 201, and relative RDS-ON on a y-axis 203. A line 205 represents a range of relative RDS-ON values over a range of temperatures. For instance, at a temperature of 25° C., a baseline RDS-ON of the transistor 101 can be drawn at a value of 1. As temperature increases to 150° C., the RDS-ON will change about 1.7 times as indicated on the graph.

Figure 3:
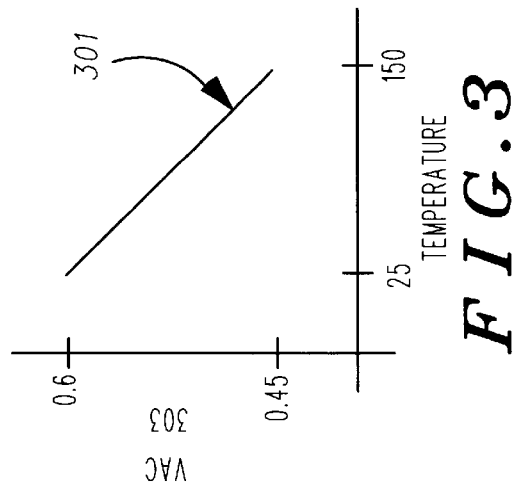
FIG. 3 is a graph showing a graphical relationship between temperature and relative output signal of a temperature-indicating device of the load driver introduced in FIG. 1.

FIG. 3 is a graph illustrating a graphical relationship between temperature, on an x-axis and temperature-indicating signal 121, marked as VAC on a y-axis 303. A line 301 represents a range of VAC signal 121 values over a range of temperatures. For instance, at a temperature of 25° C., a baseline may have a value of 0.6 volts. As temperature increases to 150° C., the VAC signal 121 declines to a value of 0.45 volts as indicated on the graph.

Figure 4:
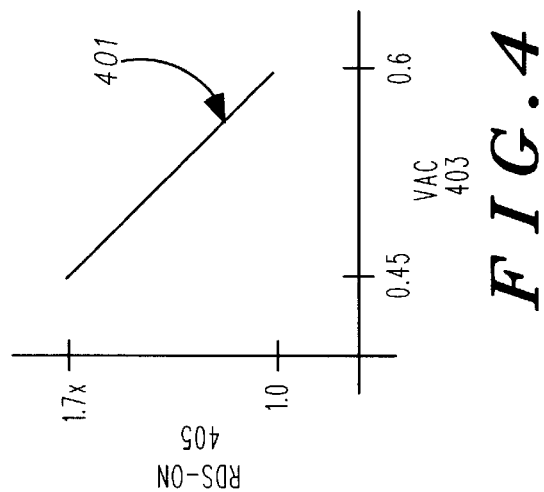
FIG. 4 is a graph illustrating a graphical relationship between an output signal of a temperature-indicating device and predicted RDS-ON of the transistor portion of the load driver introduced in FIG. 1.

Since both the range of RDS-ON 205 of the transistor 101 and the range of VAC signal 301 measured across the diode 106 are related to temperature, a combined relationship can be graphically represented. FIG. 4 is a graph illustrating a range of predicted RDS-ON, 401. The relative RDS-ON is plotted on a y-axis 405 and, the VAC signal is plotted on an x-axis 403. Note that FIG. 2 and FIG. 3 can be generated for a particular transistor or transistor family. Given these two graphs FIG. 4 can be generated. FIG. 4 then serves as a predetermined model which is later used as a lookup table in the preferred embodiment to predict an actual RDS-ON so that a load-current signal can be determined.

Once the measured VDS signal 119 is known, and the predicted RDS-ON magnitude is known based on the relationship shown in FIG. 4, the actual series load current can be computed from the following relationship.

$$I_L = \frac{VDS}{RDS}$$

Returning to FIG. 1 the translation circuit 117 includes an RDS translation stage, and a computational stage. The RDS translation stage scales (for instance via amplification) the temperature-indicating signal 121 according to the graphical relationship introduced in FIG. 4. So, a measure of temperature of the transistor 101 is used to predict the actual RDS-ON of the transistor based upon a predetermined model. Then, the computational stage (for instance using a conventional four-quadrant or two-quadrant analog-circuit based divider) determines the load-current signal by dividing the measured VDS signal 119 by the scaled (predicted RDS-ON) temperature-indicating signal 121.

Using the circuit described in FIG. 1 a more accurate loss-less load current sensing transistor driver can be constructed.

Figure 5:
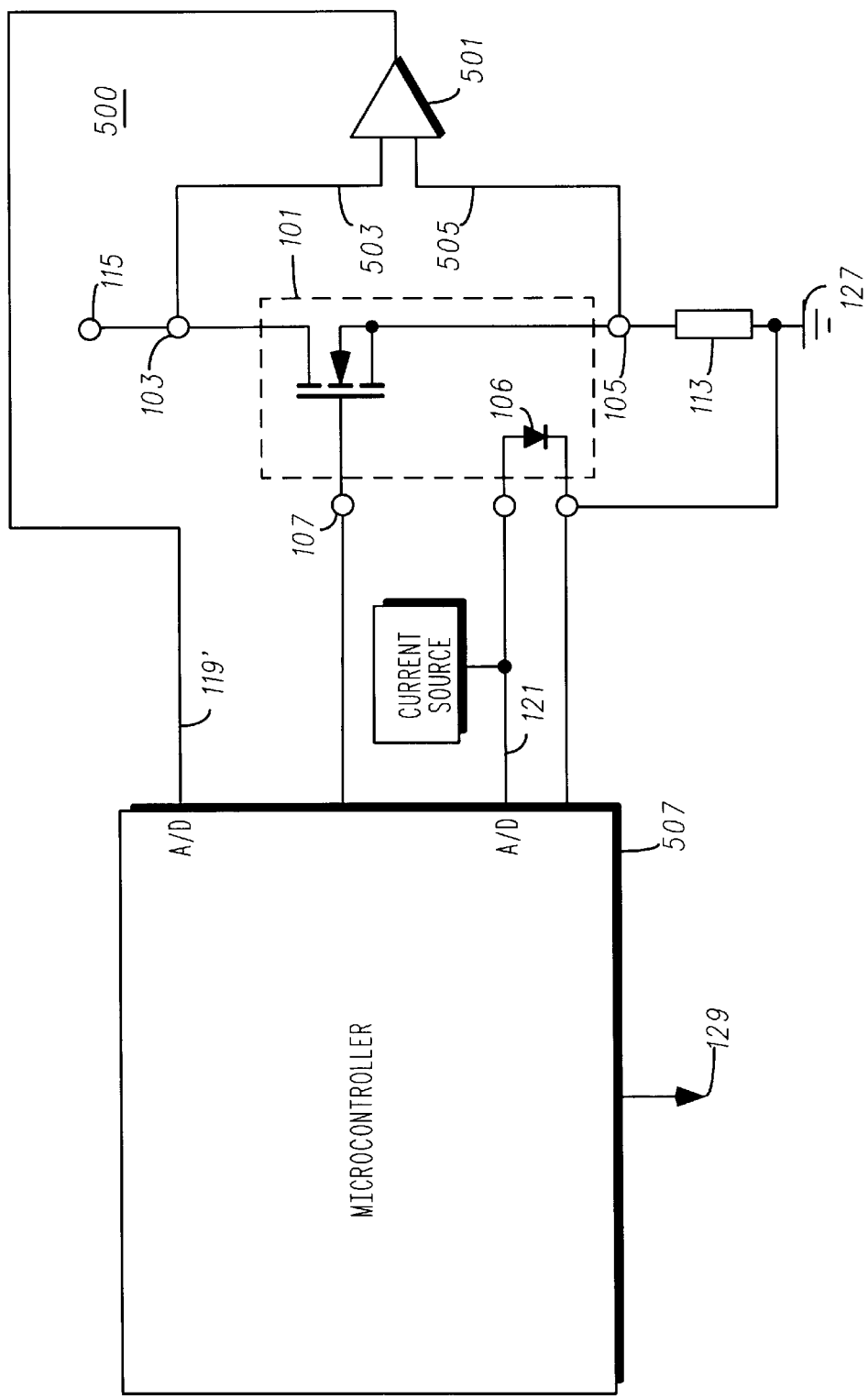
FIG. 5 is a schematic diagram of a preferred embodiment of the invention.

FIG. 5 is a schematic diagram of a preferred embodiment of the invention. Notably, a microcontroller 507 replaces the translation circuit 117 and the drive circuit 102 introduced in FIG. 1. In many electronic control systems a microcontroller is available because it is used for other purposes. Taking advantage of unused portions of the microcontroller minimizes components and complexity of the drive circuit introduced in FIG. 1.

Also, since this embodiment 500 is configured as a high-side type load driver, a differential amplifier 501 becomes part of the earlier disclosed transistor circuit and is used to measure the VDS signal. The amplifier 501 has an input 503 coupled to the drain terminal 103 of the transistor 101, and another input 505 coupled to the source terminal 105 of the transistor 101. The amplifier 501 combines magnitudes of the voltages present across the transistor 101 and provides a signal 119' to the microcontroller based translation and drive circuit 507. The microcontroller based translation and drive circuit 507 derives the load-current signal 129 by executing various method steps shown in FIG. 6. These method steps are microprogrammed into on-board memory of the microcontroller 507. Many microcontrollers can be used but in the preferred embodiment a Motorola MC68HC08 microcontroller is used. Next the preferred drive and translation method steps will be detailed.

Figure 6:
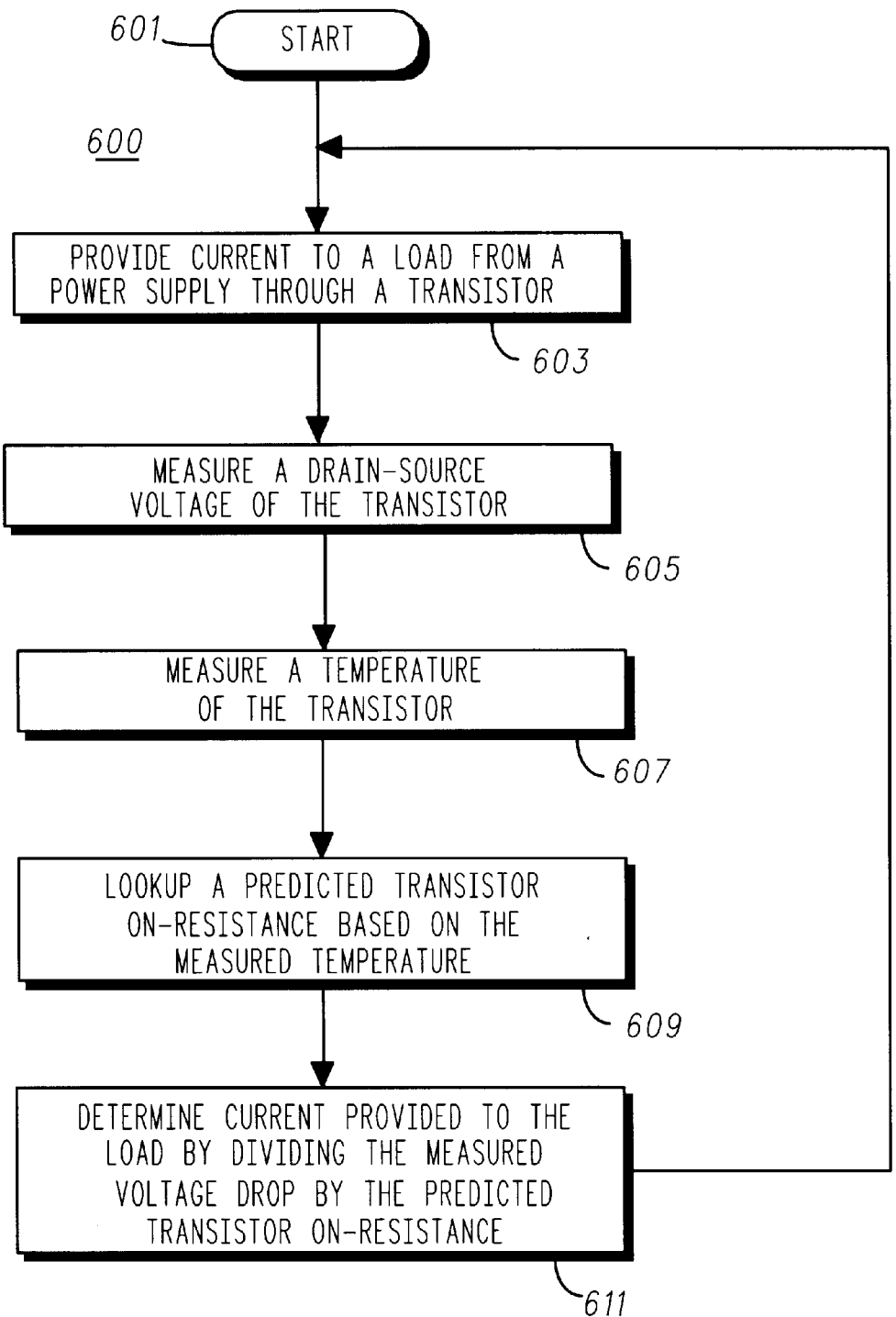
FIG. 6 is a flow graph illustration various method steps executed in the control circuit shown in FIG. 5.

FIG. 6 is a flow graph illustrating various method steps executed in the microcontroller 507. At a first step 601, the routine 600 is started.

Next, at step 603 a current is provided to the load 113 caused by the microcontroller 507 driving the gate terminal 107 of the transistor 101, thus conducting current in a series-connected circuit including the power supply terminal 115, the transistor 101, the load 113, and the ground terminal 127.

Then, responsive to step 603 a drain-source voltage (or voltage drop 119' across the transistor) is measured by the amplifier circuit 501 in step 605. The microcontroller uses an input of an integral analog to digital (A/D) converter to make the VDS measurement.

Next, in step 607, a temperature-indicating signal 121 of the transistor 101 is measured. The temperature-indicating signal 121 provided by the diode 106 is input into another input of the integral A/D converter of the microcontroller 507 to make the measurement.

Then, in step 609 the predicted transistor on-resistance (RDS-ON) is looked up in a table as modeled by FIG. 4.

Next, in step 611 the load-current signal 129, indicative of the current flowing in the series load circuit is determined by dividing the measured drain-source voltage 119' (VDS) by the predicted transistor on-resistance (RDS-ON).

Since the preferred embodiment uses fewer components than the prior art approaches (Note that the field effect transistor packaged with an integral current mirror will also require a microcontroller—so the on-board current mirror is replaced by the on-board diode) it is inherently more reliable. Also, the temperature error associated with the on-board current mirror has been eliminated with the described approach. By eliminating any lossy components, such as in-line resistors the described approaches are not generating damaging heat. Also, because no current sensing components are mounted external to the transistor 101 (such as in the case of in-line resistors and/or current transformers) the described structures are inherently more physically robust, reliable, and easier to manufacture.

What is claimed is:

1. A driver for driving a load from a power supply, the driver comprising:

a drive circuit having an output providing a drive signal;

a transistor having a gate terminal coupled to the drive circuit for receiving the drive signal, a first output terminal coupled to the power supply, and a second output terminal coupled to the load, wherein responsive to the provided drive signal the transistor provides current to the load from the power supply, and consequently a VDS signal is provided at the first output terminal;

a temperature measurement device thermally coupled to the transistor, the temperature measurement device having an output for providing a temperature-indicating signal indicative of a temperature of the transistor; and a translation circuit having a load current-indicating output for providing a load-current signal, indicative of a magnitude of the current provided to the load, dependent on the VDS signal and the temperature-indicating signal.

2. A driver in accordance with claim 1 wherein the temperature measurement device comprises a diode.

3. A driver in accordance with claim 2 further comprising a current source for driving the diode.

4. A driver in accordance with claim 1 wherein the translation circuit comprises:

a circuit for translating the temperature-indicating signal into an RDS-ON coefficient; and a divider providing the load-current signal by dividing the VDS signal by the RDS-ON coefficient.

5. A driver for driving a load from a power supply, the driver comprising:

a drive circuit having an output providing a drive voltage;

a five terminal field effect transistor device having a transistor portion comprising a gate terminal coupled to the drive circuit for receiving the drive voltage, a first output terminal coupled to the power supply, and a second output terminal coupled to the load, wherein responsive to the provided drive voltage the transistor provides current to the load from the power supply, and consequently a VDS voltage is provided at the first output terminal, the field effect transistor device having a diode portion thermally coupled to the transistor portion, the diode having an anode terminal and a cathode terminal forming an output for providing a temperature-indicating voltage indicative of a temperature of the field effect transistor; and a translation circuit having a load current-indicating output for providing a load-current signal, indicative of a magnitude of the current provided to the load, dependent on the VDS voltage and the temperature-indicating voltage.

6. A driver in accordance with claim 5 further comprising a current source for driving the diode portion of the field effect transistor device.

7. A driver in accordance with claim 6 wherein the translation circuit comprises:

a circuit for translating the temperature-indicating voltage into an RDS-ON coefficient; and a divider providing the load-current signal by dividing the VDS voltage by the RDS-ON coefficient.

8. A driver method comprising the steps of:

providing current to a load from a power supply through a transistor;

measuring a voltage drop across the transistor responsive to the step of providing current;

measuring a temperature of the transistor and providing a temperature-indicating signal indicative thereof;

translating the measured temperature-indicating signal into a predicted transistor on-resistance; and determining a magnitude of the current provided to the load dependent on the measured voltage drop across the transistor and the predicted transistor on-resistance.

9. A method in accordance with claim 8 wherein the step of translating the measured temperature-indicating signal comprises indexing a lookup table using the measured temperature-indicating signal and extracting the predicted transistor on-resistance.

10. A method in accordance with claim 9 wherein the step of determining a magnitude of the current provided to the load comprises a step of dividing the measured drain-source voltage by the predicted transistor on-resistance.

11. A method in accordance with claim 8 wherein the step of determining a magnitude of the current provided to the load comprises a step of dividing the measured drain-source voltage by the predicted transistor on-resistance.

12. A driver for driving a load from a power supply, the driver comprising:

a drive circuit having an output providing a drive signal;

a transistor circuit having a gate terminal coupled to the drive circuit for receiving the drive signal, a first output terminal coupled to the power supply, and a second output terminal coupled to the load, wherein responsive to the provided drive signal the transistor provides current to the load from the power supply, and consequently a VDS signal is provided indicative of a voltage difference between the first output terminal and the second output terminal;

a temperature measurement device thermally coupled to the transistor, the temperature measurement device having an output for providing a temperature-indicating signal indicative of a temperature of the transistor; and a translation circuit having a load current-indicating output for providing a load-current signal, indicative of a magnitude of the current provided to the load, dependent on the VDS signal and the temperature-indicating signal.

13. A driver in accordance with claim 12 wherein the temperature measurement device comprises a diode.

14. A driver in accordance with claim 13 further comprising a current source for driving the diode.

15. A driver in accordance with claim 12 wherein the translation circuit comprises:

a circuit for translating the temperature-indicating signal into an RDS-ON coefficient; and a divider providing the load-current signal by dividing the VDS signal by the RDS-ON coefficient.

* * * * *